US011780035B2

(12) United States Patent
Shimoishi et al.

(10) Patent No.: US 11,780,035 B2
(45) Date of Patent: Oct. 10, 2023

(54) SOLDER COMPOSITION AND ELECTRONIC SUBSTRATE

(71) Applicant: TAMURA CORPORATION, Tokyo (JP)

(72) Inventors: Ryutaro Shimoishi, Iruma (JP); Isao Sugiyama, Iruma (JP); Daigo Ichikawa, Iruma (JP)

(73) Assignee: Tamura Corporation, Tokyo (JP)

( * ) Notice: Subject to any disclaimer, the term of this patent is extended or adjusted under 35 U.S.C. 154(b) by 121 days.

(21) Appl. No.: 17/480,178

(22) Filed: Sep. 21, 2021

(65) Prior Publication Data
US 2022/0097181 A1 Mar. 31, 2022

(30) Foreign Application Priority Data

Sep. 25, 2020 (JP) ................ 2020-161098

(51) Int. Cl.
*B23K 35/362* (2006.01)
*B23K 35/36* (2006.01)
*H05K 13/04* (2006.01)

(52) U.S. Cl.
CPC ........ *B23K 35/362* (2013.01); *B23K 35/3613* (2013.01); *B23K 35/3615* (2013.01); *B23K 35/3618* (2013.01); *H05K 13/0465* (2013.01)

(58) Field of Classification Search
CPC ................................................ B23K 35/362
See application file for complete search history.

(56) References Cited

U.S. PATENT DOCUMENTS

| 2013/0082089 A1* | 4/2013 | Gallagher | B23K 1/203 228/176 |
| 2019/0366487 A1* | 12/2019 | Kawasaki | B23K 35/025 |

FOREIGN PATENT DOCUMENTS

| JP | 5887330 | 3/2016 | |
| JP | 2017-064784 A | 4/2017 | |
| JP | 2018-083211 A | 5/2018 | |
| JP | 2020-055035 A | 4/2020 | |
| JP | 2020-142264 A | 9/2020 | |
| WO | WO-2019102671 A1 * | 5/2019 | ......... B23K 35/0244 |

OTHER PUBLICATIONS

Japanese Office Action dated Aug. 16, 2022 issued in corresponding Japanese application No. 2020-161098; English translation included (6 pages).

* cited by examiner

*Primary Examiner* — Jophy S. Koshy
(74) *Attorney, Agent, or Firm* — Rankin, Hill & Clark LLP

(57) ABSTRACT

A solder composition of the invention contains: a flux composition containing (A) a rosin resin, (B) an activator, (C) an imidazoline compound having a phenyl group, and (D) an antioxidant; and (E) solder powder, in which the (B) component contains (B1) an organic acid, the (B1) component contains at least one selected from the group consisting of (B11) 1-hydroxy-2-naphthoic acid, 3-hydroxy-2-naphthoic acid, and 1,4-dihydroxy-2-naphthoic acid, and the (C) component is at least one selected from the group consisting of 2-phenylimidazoline and 2-benzylimidazoline.

10 Claims, No Drawings

US 11,780,035 B2

SOLDER COMPOSITION AND ELECTRONIC SUBSTRATE

The entire disclosure of Japanese Patent Application No. 2020-161098 filed Sep. 25, 2020 is expressly incorporated by reference herein.

TECHNICAL FIELD

The present invention relates to a solder composition and an electronic substrate.

BACKGROUND ART

A solder composition is a paste mixture provided by kneading solder powder and a flux composition (a composition containing, for instance, a rosin resin, activator and solvent) (see Patent Literature 1: JP 5887330 B). Lead-free solder containing no lead (Pb) has recently been widely used in view of environmental issues. Further, there has been a demand for a halogen-free composition containing a reduced amount of halogen (inclusive of zero) or a non-halogen composition containing no halogen as a flux composition in view of environmental issues.

However, a halogen-free or non-halogen solder composition typically does not have sufficient wettability of solder. Further, a solder composition containing an amine activator instead of a halogen activator does not achieve both favorable wettability and viscosity stability.

SUMMARY OF THE INVENTION

An object of the invention is to provide a solder composition achieving both excellent wettability and viscosity stability although being a halogen-free or non-halogen composition, and an electronic substrate using the solder composition.

According to an aspect of the invention, a solder composition contains: a flux composition containing (A) a rosin resin, (B) an activator, (C) an imidazoline compound having a phenyl group, and (D) an antioxidant; and (E) solder powder, in which the (B) component contains (B1) an organic acid, the (B1) component contains at least one selected from the group consisting of (B11) 1-hydroxy-2-naphthoic acid, 3-hydroxy-2-naphthoic acid, and 1,4-dihydroxy-2-naphthoic acid, and the (C) component is at least one selected from the group consisting of 2-phenylimidazoline and 2-benzylimidazoline.

In the solder composition according to the above aspect of the invention, it is preferable that the (B1) component contains at least one selected from the group consisting of (B12) succinic acid and glutaric acid.

In the solder composition according to the above aspect of the invention, it is preferable that the (D) component contains at least one selected from the group consisting of a hindered phenol compound, 3,3'-thiodipropionic acid didodecyl, and 1,2,3-benzotriazole.

In the solder composition according to the above aspect of the invention, it is preferable that the hindered phenol compound is at least one selected from the group consisting of pentaerythritol tetrakis[3-(3,5-di-tert-butyl-4-hydroxyphenyl)propionate], bis[3-(3-tert-butyl-4-hydroxy-5-methylphenyl)propionic acid][ethylenebis(oxyethylene)], N,N'-bis[2-[2-(3,5-di-tert-butyl-4-hydroxyphenyl)ethylcarbonyloxy]ethyl]oxamide, and N,N'-bis{3-(3,5-di-tert-butyl-4-hydroxyphenyl)propionyl}hydrazine.

An electronic substrate according to another aspect of the invention includes a soldered portion to which the solder composition according to the above aspect of the invention is applied.

According to the above aspects of the invention, a solder composition achieving both excellent wettability and viscosity stability although being a halogen-free or non-halogen composition, and an electronic substrate using the solder composition can be provided.

DESCRIPTION OF EMBODIMENT(S)

Flux Composition

Initially, a flux composition used in an exemplary embodiment will be described. The flux composition used in the exemplary embodiment, which is a component other than solder powder in a solder composition, contains (A) a rosin resin, (B) an activator, (C) an imidazoline compound having a phenyl group, and (D) an antioxidant. Each component will be described below.

(A) Component

Examples of (A) the rosin resin used in the exemplary embodiment include rosins and rosin-modified resins. Examples of the rosins include gum rosin, wood rosin and tall oil rosin. Examples of the rosin-modified resins include disproportionated rosin, polymerized rosin, hydrogenated rosin, and derivatives thereof. Examples of the hydrogenated rosin include fully hydrogenated rosin, partially hydrogenated rosin, and hydrogenated product of unsaturated-organic-acid modified rosin (also referred to as "hydrogenated acid modified rosin"), which is modified rosin of an unsaturated organic acid such as an aliphatic unsaturated monobasic acid (e.g., (meth)acrylic acid), an aliphatic unsaturated dibasic acid (e.g., α,β-unsaturated carboxylic acid such as fumaric acid and maleic acid), and an unsaturated carboxylic acid having an aromatic ring (e.g., cinnamic acid). These rosin resins may be used singly or in combination of two or more kinds thereof.

A content of the (A) component with respect to 100 mass % of the flux composition is preferably in a range from 20 mass % to 70 mass %, more preferably in a range from 30 mass % to 60 mass %. At a content of the (A) component of equal to or more than the above lower limit, so-called solderability (a property of preventing oxidation of a copper-foil surface of a soldering land so that molten solder easily gets wet on the copper-foil surface) can be improved to sufficiently reduce solder balls. Meanwhile, at a content of the (A) component of equal to or less than the above upper limit, an amount of the flux residue can be sufficiently reduced.

(B) Component (B) The activator used in the exemplary embodiment contains (B1) an organic acid. Further, the (B1) component contains at least one selected from the group consisting of (B1) 1-hydroxy-2-naphthoic acid, 3-hydroxy-2-naphthoic acid, and 1,4-dihydroxy-2-naphthoic acid. Among the above, 3-hydroxy-2-naphthoic acid is preferable in terms of solder meltability. The (B111) component improves wettability while maintaining viscosity stability even without using a halogen activator.

In terms of wettability, the (B1) component preferably contains at least one selected from the group consisting of (B12) succinic acid and glutaric acid in addition to the (B111) component.

The (B1) component may contain a monocarboxylic acid, a dicarboxylic acid and/or other organic acids (hereinafter occasionally referred to as a (B13) component) in addition to the (B111) and (B12) components. The above substances may be used singly or in combination of two or more kinds thereof.

Examples of the monocarboxylic acid include formic acid, acetic acid, propionic acid, butyric acid, valeric acid, caproic acid, enanthic acid, capric acid, lauryl acid, myristic acid, pentadecyl acid, palmitin acid, margaric acid, stearic acid, tuberculostearic acid, arachidic acid, behenic acid, lignoceric acid, and glycolic acid.

Examples of the dicarboxylic acid include oxalic acid, malonic acid, adipic acid, pimelic acid, suberic acid, azelaic acid, sebacic acid, dodecanedioic acid, eicosanedioic acid, fumaric acid, maleic acid, tartaric acid, and diglycol acid.

Examples of the other organic acids include dimer acid, trimer acid, levulinic acid, lactic acid, acrylic acid, benzoic acid, salicylic acid, anisic acid, citric acid, and picolinic acid.

A content of the (B1) component with respect to 100 mass % of the flux composition is preferably in a range from 1 mass % to 30 mass %, more preferably in a range from 3 mass % to 20 mass %, particularly preferably in a range from 5 mass % to 15 mass %.

The (B) component may further contain other activators (e.g., (B2) a halogen activator and (B3) an organic acid amine) in addition to the (B1) component as long as an object of the invention is achievable. It should be noted, however, that the (B) component preferably consists of the (B1) component in order to be halogen-free. A total content of the (B1) component with respect to 100 mass % of the (B) component is preferably 85 mass % or more, more preferably 90 mass % or more, particularly preferably 95 mass % or more.

A content of the (B) component with respect to 100 mass % of the flux composition is preferably in a range from 3 mass % to 35 mass %, more preferably in a range from 5 mass % to 22 mass %, particularly preferably in a range from 7 mass % to 20 mass %. A content of the (B) component of equal to or more than the above lower limit is likely to improve an activation effect. Meanwhile, a content of the (B) component of equal to or less than the above upper limit is likely to maintain an insulating property of the flux composition.

(C) Component

Examples of (C) the imidazoline compound having a phenyl group used in the exemplary embodiment include 2-phenylimidazoline and 2-benzylimidazoline. The (C) component improves wettability while maintaining viscosity stability. Among the above, 2-benzylimidazoline is more preferable in terms of viscosity stability.

A content of the (C) component with respect to 100 mass % of the flux composition is preferably in a range from 0.1 mass % to 15 mass %, more preferably in a range from 0.5 mass % to 10 mass %, particularly preferably in a range from 1 mass % to 8 mass %. A content of the (C) component falling within the above range can improve wettability while maintaining viscosity stability.

(D) Component

Known antioxidants can be suitably used for (D) the antioxidant used in the exemplary embodiment. The (D) component can inhibit copper corrosion caused by the (B) component. That is, although use of a non-halogen activator is likely to cause copper corrosion due to the (B) component, combined use of the (B) and (D) components can improve wettability while inhibiting copper corrosion. Examples of the antioxidant include a sulfur compound (e.g., 3,3'-thiodipropionic acid didodecyl), a benzotriazole compound (e.g., 1,2,3-benzotriazole), a hindered phenol compound, and a phosphite compound. Among the above, a hindered phenol compound, 3,3'-thiodipropionic acid didodecyl, and 1,2,3-benzotriazole are preferable.

Examples of the hindered phenol compound include pentaerythritol tetrakis[3-(3,5-di-tert-butyl-4-hydroxyphenyl) propionate], bis[3-(3-tert-butyl-4-hydroxy-5-methylphenyl) propionic acid][ethylenebis(oxyethylene)], N,N'-bis[2-[2-(3,5-di-tert-butyl-4-hydroxyphenyl)ethylcarbonyloxy]ethyl] oxamide, and N,N'-bis{3-(3,5-di-tert-butyl-4-hydroxyphenyl)propionyl}hydrazine.

A content of the (D) component with respect to 100 mass % of the flux composition is preferably in a range from 0.1 mass % to 10 mass %, more preferably in a range from 0.5 mass % to 7 mass %, particularly preferably in a range from 1 mass % to 5 mass %. A content of the (D) component falling within the above range can improve solder meltability.

Solvent

The flux composition of the exemplary embodiment preferably further contains a solvent in terms of printability and the like. Known solvents can be suitably used for the solvent used herein. The above solvent preferably has a boiling point of 170 degrees C. or more.

Examples of the solvent include diethylene glycol, dipropylene glycol, triethylene glycol, hexylene glycol, hexyl diglycol, 1,5-pentanediol, methyl carbitol, butyl carbitol, 2-ethylhexyl diglycol (EHDG), octanediol, phenyl glycol, diethylene glycol monohexyl ether, tetraethylene glycol dimethyl ether, and dibutyl maleic acid. These solvents may be used singly or in combination of two or more kinds thereof.

A content of the solvent in use with respect to 100 mass % of the flux composition is preferably in a range from 10 mass % to 60 mass %, more preferably in a range from 20 mass % to 40 mass %. At a content of the solvent falling within the above range, viscosity of the resulting solder composition can be suitably adjusted to fall within an appropriate range.

Thixotropic Agent

The flux composition of the exemplary embodiment preferably further contains a thixotropic agent in terms of printability and the like. Examples of the thixotropic agent used herein include hardened castor oil, amides, kaolin, colloidal silica, organic bentonite, and glass frit. The above substances may be used singly or in combination of two or more kinds thereof.

A content of the thixotropic agent with respect to 100 mass % of the flux composition is preferably in a range from 1 mass % to 20 mass %, more preferably in a range from 2 mass % to 12 mass %. A content of the thixotropic agent of less than the above lower limit cannot exhibit thixotropy, making dripping likely to occur. Meanwhile, a content of the thixotropic agent exceeding the above upper limit exhibits excessively high thixotropy, making printing defect likely to occur.

Other Components

In addition to the (A), (B), (C) and (D) components, the solvent and the thixotropic agent, other additives and/or other resins may be added as required to the flux composition used in the exemplary embodiment. Examples of the other additives include an antifoaming agent, modifier, delustering agent, and foaming agent. A content of the additive(s) with respect to 100 mass % of the flux composition is preferably in a range from 0.01 mass % to 5 mass %. Examples of the other resins include an acrylic resin and polybutadiene.

Solder Composition

Next, the solder composition of the exemplary embodiment will be described. The solder composition of the exemplary embodiment contains the above flux composition of the exemplary embodiment and (E) solder powder as described below.

A content of the flux composition with respect to 100 mass % of the solder composition is preferably in a range from 5 mass % to 35 mass %, more preferably in a range from 7 mass % to 15 mass %, particularly preferably in a range from 8 mass % to 12 mass %. At a content of the flux composition of less than 5 mass % (i.e., at a content of the solder powder exceeding 95 mass %), the amount of the flux composition is insufficient as a binder, making the flux composition unlikely to easily mix with the solder powder. Meanwhile, at a content of the flux composition exceeding 35 mass % (i.e., at a content of the solder powder of less than 65 mass %), the resulting solder composition is unlikely to form a desired solder joint.

The solder composition of the exemplary embodiment, although which is a halogen-free or non-halogen composition, is excellent in both wettability and viscosity stability during storage. The solder composition of the exemplary embodiment, although which is a solder composition usable as a halogen-free composition for a printed circuit board, can ensure solder wettability comparable to that of a solder composition containing a halogen activator, and thus can be particularly favorably used as a halogen-free or non-halogen solder composition.

In the halogen-free solder composition, a chlorine concentration is preferably 900 mass ppm or less (more preferably 100 mass ppm or less, particularly preferably 0 mass ppm), a bromine concentration is preferably 900 mass ppm or less (more preferably 100 mass ppm or less, particularly preferably 0 mass ppm), an iodine concentration is 900 mass ppm or less (more preferably 100 mass ppm or less, particularly preferably 0 mass ppm), and a halogen concentration is 1500 mass ppm or less (more preferably 300 mass ppm or less, particularly preferably 0 mass ppm). Examples of the halogen include fluorine, chlorine, bromine and iodine.

It should be noted that the chlorine concentration, bromine concentration and halogen concentration in the solder composition can be measured according to a method described in JEITA ET-7304A. These concentrations can also be simply calculated based on the components of the solder composition and contents thereof.

(E) Component (E) The solder powder used in the exemplary embodiment preferably consists of lead-free solder powder. However, (E) the solder powder may be leaded solder powder. A solder alloy in the solder powder preferably contains at least one selected from the group consisting of stannum (Sn), copper (Cu), zinc (Zn), silver (Ag), antimony (Sb), lead (Pb), indium (In), bismuth (Bi), nickel (Ni), cobalt (Co), and germanium (Ge).

The solder alloy in the solder powder is preferably an alloy containing stannum as a main component. The solder alloy more preferably contains stannum, silver and copper. The solder alloy may contain at least one of antimony, bismuth, or nickel as an additive element. The flux composition of the exemplary embodiment, even when containing a solder alloy containing an easily oxidizable additive element such as antimony, bismuth and nickel, can reduce occurrence of voids.

Here, the "lead-free solder powder" means powder of solder metal or alloy to which lead is not added. However, lead as an unavoidable impurity may be contained in the lead-free solder powder. In this case, an amount of the lead is preferably 300 mass ppm or less.

Specific examples of the alloy in the lead-free solder powder include Sn—Ag—Cu, Sn—Cu, Sn—Ag, Sn—Bi, Sn—Ag—Bi, Sn—Ag—Cu—Bi, Sn—Ag—Cu—Ni, Sn—Ag—Cu—Bi—Sb, Sn—Ag—Bi—In, and Sn—Ag—Cu—Bi—In—Sb.

An average particle size of the (E) component, which is typically in a range from 1 µm to 40 µm, is more preferably in a range from 1 µm to 35 µm, further more preferably in a range from 2 µm to 35 µm, particularly preferably in a range from 3 µm to 32 µm in view of applicability to an electronic substrate having narrow pitches between solder pads. Incidentally, the average particle size can be measured with a particle-size measurement device using dynamic light scattering.

Manufacturing Method of Solder Composition

The solder composition of the exemplary embodiment can be manufactured by containing the above-described flux composition and (E) the above-described solder powder at the above predetermined ratio, followed by mixing with agitation.

Electronic Substrate

Next, the electronic substrate of the exemplary embodiment will be described. The electronic substrate of the exemplary embodiment includes a soldered portion where the above-described solder composition is applied. The electronic substrate of the exemplary embodiment can be manufactured by mounting an electronic component on an electronic substrate (e.g., printed circuit board) using the solder composition.

The solder composition of the exemplary embodiment has excellent wettability. Accordingly, favorable soldering can be performed even in a case where a material of an electrode of the electronic component is, for instance, albata or stannum-plated.

Examples of a coating applicator to be used herein include a screen printer, a metal mask printer, a dispenser, and a jet dispenser.

The electronic component can be mounted on the electronic substrate by a reflow process, in which the electronic component is placed on the solder composition applied by the coating applicator and heated by a reflow furnace under predetermined conditions to mount the electronic component on the printed circuit board.

In the reflow process, the electronic component is placed on the solder composition and heated by the reflow furnace under the predetermined conditions. Through the reflow process, a desired solder joint can be formed between the electronic component and the printed circuit board. As a result, the electronic component can be mounted on the printed circuit board.

The conditions for the reflow process may be suitably set depending on a melting point of the solder. For instance, a preheating temperature is preferably in a range from 140 degrees C. to 200 degrees C., more preferably in a range from 150 degrees C. to 160 degrees C. A preheating time is preferably in a range from 60 seconds to 120 seconds. A peak temperature is preferably in a range from 230 degrees C. to 270 degrees C., more preferably in a range from 240 degrees C. to 255 degrees C. A retention time at a temperature of 220 degrees C. or more is preferably in a range from 20 seconds to 60 seconds.

Incidentally, the solder composition and the electronic substrate of the exemplary embodiment are not limited by the above exemplary embodiment and thus may be modified and/or improved as long as an object of the invention is achievable.

For instance, the printed circuit board and the electronic component of the electronic substrate are bonded through the reflow process. However, any other process than the reflow process may be used. For instance, the printed circuit board and the electronic component may be bonded by heating the solder composition using a laser beam (i.e., laser heating process) instead of the reflow process. In this case, any laser beam source can be suitably used depending on a wavelength corresponding to an absorption band of the metal. Examples of the laser beam source include a solid-state laser (e.g., ruby, glass and YAG), a semiconductor laser (e.g., GaAs and InGaAsP), a liquid laser (e.g., pigment), and a gas laser (e.g., He—Ne, Ar, $CO_2$ and excimer).

EXAMPLE(S)

Next, the invention is further described in detail with reference to Examples and Comparatives but the scope of the invention is by no means limited by these Examples and Comparatives. It should be noted that materials used in Examples and Comparatives are as follows.

(A) Component
Rosin resin: hydrogenated acid modified rosin, trade name "PINECRYSTAL KE-604", manufactured by ARAKAWA CHEMICAL INDUSTRIES, LTD.

(B12) Component
Organic acid A: succinic acid
Organic acid B: glutaric acid (B13) Component
Organic acid C: eicosanedioic acid, trade name "SL-20", manufactured by Okamoto Oil Mill, Ltd.
Organic acid D: sebacic acid (B11) Component
Organic acid E: 3-hydroxy-2-naphthoic acid (C) Component
Imidazoline compound A: 2-phenylimidazoline
Imidazoline compound B: 2-benzylimidazoline (D) Component
Antioxidant A: N,N'-bis{3-(3,5-di-tert-butyl-4-hydroxyphenyl)propionyl}hydrazine, trade name "Irganox MD1024", manufactured by BASF Japan Ltd.
Antioxidant B: N,N'-bis[2-[2-(3,5-di-tert-butyl-4-hydroxyphenyl)ethylcarbonyloxy]ethyl]oxamide, trade name "Naugard XL-1", manufactured by SHIRAISHI CALCIUM KAISHA, LTD.
Antioxidant C: 1,2,3-benzotriazole, trade name "VERZONE Crysta", manufactured by Daiwa Fine Chemicals Co., Ltd.
Antioxidant D: 3,3'-thiodipropionic acid didodecyl, trade name "SUMILIZER TPL-R", manufactured by SUMITOMO CHEMICAL COMPANY, LIMITED Other Components
Imidazoline compound C: 2-methylimidazoline
Imidazoline compound D: 2-propylimidazoline
Imidazole compound A: 2-ethylimidazole
Imidazole compound B: 2-ethyl-4-methylimidazole
Imidazole compound C: 2-phenyl-4-methylimidazole
Solvent: diethylene glycol mono-2-ethylhexyl ether (2-ethylhexyl diglycol (EHDG), boiling point: 272 degrees C.), manufactured by NIPPON NYUKAZAI CO., LTD.
Thixotropic agent: trade name "TALEN VA-79", manufactured by Kyoeisha Chemical Co., Ltd.
Polybutadiene: trade name "BI-2000", manufactured by Nippon Soda Co., Ltd.

(E) Component
Solder powder: alloy composition of Sn-3.0Ag-0.5Cu, particle size distribution ranging from 15 to 25 μm, solder melting point ranging from 217 to 220 degrees C.

Example 1

The rosin resin of 45 mass %, the organic acid A of 2 mass %, the organic acid B of 2 mass %, the organic acid C of 1 mass %, the organic acid D of 1 mass %, the organic acid E of 1 mass %, the imidazoline compound A of 5 mass %, the solvent of 31 mass %, the antioxidant of 3 mass %, polybutadiene of 2 mass %, and the thixotropic agent of 7 mass % were put into a container and mixed using a planetary mixer to obtain a flux composition.

Subsequently, the resulting flux composition of 12 mass % and solder powder of 88 mass % (100 mass % in total) were put into a container and mixed using a planetary mixer to prepare a solder composition.

Examples 2 to 5

Solder compositions were each prepared in the same manner as in Example 1 except that the above materials were added in accordance with each of compositions shown in Table 1.

Comparatives 1 to 8

Solder compositions were each prepared in the same manner as in Example 1 except that the above materials were added in accordance with each of compositions shown in Table 1.

Evaluation of Solder Composition
Each solder composition was evaluated as follows (in terms of state, viscosity stability, wettability, and copper corrosion). The obtained results are shown in Table 1. It should be noted that a solder composition having an unfavorable state was not evaluated for any of viscosity stability and wettability.

(1) Properties and State
The prepared solder composition was used for printing and evaluated for properties and state in accordance with the following criteria.
B: A solder composition is printable.
C: A solder composition is in an unsmooth paste state (including aggregates), that is, in an unprintable state.

(2) Viscosity Stability
The solder composition was put into a container and left at a temperature of 25 degrees C. for two to three hours. After opening a lid of the container, the solder composition was stirred in the container for one to two minutes using a spatula so as to keep air from being trapped. Subsequently, the container was put into a viscometer (trade name: PCU105, manufactured by Malcom Co., Ltd.) and agitated at a rotation speed of 10 rpm at a temperature of 25 degrees C. for about three minutes. Then, the rotation was stopped until the temperature became constant. After the temperature was adjusted, the container was agitated at a rotation speed of 10 rpm for three minutes to measure viscosity of the solder composition.

After the container was agitated at a rotation speed of 10 rpm at a temperature of 25 degrees C. for 24 hours, the viscosity was measured again.

Viscosity stability was evaluated in accordance with the following criteria on the basis of a result of a difference between viscosity values (post-agitation viscosity−initial viscosity).

A: A difference between viscosity values is in a range from −5 Pa·s to 5 Pa·s.

B: A difference between viscosity values is −15 Pa·s or more and less than −5 Pa·s, or more than 5 Pa·s and 15 Pa·s or less.

C: A difference between viscosity values is less than −30 Pa·s or more than 30 Pa·s.

(3) Wettability

A meniscograph method (test device: solder checker SAT-5100, test piece: a substrate (stannum-plated copper plate and albata substrate) degraded through oxidation at 130 degrees C. for 20 minutes) was used to measure a zero cross time (time until a wetting force reaches zero). It should be noted that a shorter zero cross time exhibits excellent wettability.

(4) Copper Corrosion (Copper Mirror Corrosion Test)

A copper mirror corrosion test was performed in accordance with a method described in J-STD-004B to evaluate copper corrosion. A result of the copper mirror corrosion test was determined as "B" for "No Breakthrough" and "C" for other cases.

TABLE 1

|  |  |  |  |  | Examples |  |  |  |  | Comparatives |  |
|---|---|---|---|---|---|---|---|---|---|---|---|
|  |  |  |  |  | 1 | 2 | 3 | 4 | 5 | 1 | 2 |
| Components of Flux Composition (mass %) | (A) |  |  | Rosin Resin | 45.0 | 45.0 | 45.0 | 45.0 | 45.0 | 45.0 | 45.0 |
|  | (B) | (B12) |  | Organic Acid A | 2.0 | 2.0 | 2.0 | 2.0 | 2.0 | 2.0 | 2.0 |
|  |  |  |  | Organic Acid B | 2.0 | 2.0 | 2.0 | 2.0 | 2.0 | 2.0 | 2.0 |
|  |  | (B13) |  | Organic Acid C | 1.0 | 1.0 | 1.0 | 1.0 | 1.0 | 1.0 | 1.0 |
|  |  |  |  | Organic Acid D | 1.0 | 1.0 | 1.0 | 1.0 | 1.0 | 1.0 | 1.0 |
|  |  | (B11) |  | Organic Acid E | 1.0 | 1.0 | 1.0 | 1.0 | 1.0 | 1.0 | 1.0 |
|  | (C) |  |  | Imidazoline Compound A | 5.0 | — | 5.0 | 5.0 | 5.0 | — | — |
|  |  |  |  | Imidazoline Compound B | — | 5.0 | — | — | — | — | — |
|  | Other Components |  |  | Imidazoline Compound C | — | — | — | — | — | — | 5.0 |
|  |  |  |  | Imidazoline Compound D | — | — | — | — | — | — | — |
|  |  |  |  | Imidazole Compound A | — | — | — | — | — | — | — |
|  |  |  |  | Imidazole Compound B | — | — | — | — | — | — | — |
|  |  |  |  | Imidazole Compound C | — | — | — | — | — | — | — |
|  | (D) |  |  | Antioxidant A | 3.0 | 3.0 | — | — | — | 3.0 | 3.0 |
|  |  |  |  | Antioxidant B | — | — | 3.0 | — | — | — | — |
|  |  |  |  | Antioxidant C | — | — | — | 3.0 | — | — | — |
|  |  |  |  | Antioxidant D | — | — | — | — | 3.0 | — | — |
|  | Other Components |  |  | Solvent | 31.0 | 31.0 | 31.0 | 31.0 | 31.0 | 36.0 | 31.0 |
|  |  |  |  | Thixotropic Agent | 7.0 | 7.0 | 7.0 | 7.0 | 7.0 | 7.0 | 7.0 |
|  |  |  |  | Polybutadiene | 2.0 | 2.0 | 2.0 | 2.0 | 2.0 | 2.0 | 2.0 |
|  |  |  |  | Flux Composition in Total | 100.0 | 100.0 | 100.0 | 100.0 | 100.0 | 100.0 | 100.0 |
| Components of Solder Composition (mass %) |  |  |  | Flux Composition | 12.0 | 12.0 | 12.0 | 12.0 | 12.0 | 12.0 | 12.0 |
|  |  |  | (E) | Solder Powder | 88.0 | 88.0 | 88.0 | 88.0 | 88.0 | 88.0 | 88.0 |
|  |  |  |  | Solder Composition in Total | 100.0 | 100.0 | 100.0 | 100.0 | 100.0 | 100.0 | 100.0 |
| Evaluation Results | (1) State |  |  |  | B | B | B | B | B | B | C |
|  | (2) Viscosity Stability |  |  |  | B | A | B | B | B | B | — |
|  | (3) Wettability |  |  | Stannum Plated | 1.24 | 1.14 | 1.26 | 1.26 | 1.25 | 1.30 | 1.25 |
|  |  |  |  | Albata | 0.75 | 0.74 | 0.77 | 0.78 | 0.75 | 1.31 | 0.69 |
|  | (4) Copper Corrosion |  |  |  | B | B | B | B | B | B | B |

|  |  |  |  |  | Comparatives |  |  |  |  |  |
|---|---|---|---|---|---|---|---|---|---|---|
|  |  |  |  |  | 3 | 4 | 5 | 6 | 7 | 8 |
| Components of Flux Composition (mass %) | (A) |  |  | Rosin Resin | 45.0 | 45.0 | 45.0 | 45.0 | 45.0 | 45.0 |
|  | (B) | (B12) |  | Organic Acid A | 2.0 | 2.0 | 2.0 | 2.0 | 2.0 | 2.0 |
|  |  |  |  | Organic Acid B | 2.0 | 2.0 | 2.0 | 2.0 | 2.0 | 2.0 |
|  |  | (B13) |  | Organic Acid C | 1.0 | 1.0 | 1.0 | 1.0 | 1.0 | 1.0 |
|  |  |  |  | Organic Acid D | 1.0 | 1.0 | 1.0 | 1.0 | 1.0 | 1.0 |
|  |  | (B11) |  | Organic Acid E | 1.0 | 1.0 | 1.0 | 1.0 | — | 1.0 |
|  | (C) |  |  | Imidazoline Compound A | — | — | — | — | 5.0 | 5.0 |
|  |  |  |  | Imidazoline Compound B | — | — | — | — | — | — |
|  | Other Components |  |  | Imidazoline Compound C | — | — | — | — | — | — |
|  |  |  |  | Imidazoline Compound D | 5.0 | — | — | — | — | — |
|  |  |  |  | Imidazole Compound A | — | 5.0 | — | — | — | — |
|  |  |  |  | Imidazole Compound B | — | — | 5.0 | — | — | — |
|  |  |  |  | Imidazole Compound C | — | — | — | 5.0 | — | — |
|  | (D) |  |  | Antioxidant A | 3.0 | 3.0 | 3.0 | 3.0 | 3.0 | — |
|  |  |  |  | Antioxidant B | — | — | — | — | — | — |
|  |  |  |  | Antioxidant C | — | — | — | — | — | — |
|  |  |  |  | Antioxidant D | — | — | — | — | — | — |
|  | Other Components |  |  | Solvent | 31.0 | 31.0 | 31.0 | 31.0 | 32.0 | 34.0 |
|  |  |  |  | Thixotropic Agent | 7.0 | 7.0 | 7.0 | 7.0 | 7.0 | 7.0 |
|  |  |  |  | Polybutadiene | 2.0 | 2.0 | 2.0 | 2.0 | 2.0 | 2.0 |
|  |  |  |  | Flux Composition in Total | 100.0 | 100.0 | 100.0 | 100.0 | 100.0 | 100.0 |
| Components of Solder Composition (mass %) |  |  |  | Flux Composition | 12.0 | 12.0 | 12.0 | 12.0 | 12.0 | 12.0 |
|  |  |  | (E) | Solder Powder | 88.0 | 88.0 | 88.0 | 88.0 | 88.0 | 88.0 |
|  |  |  |  | Solder Composition in Total | 100.0 | 100.0 | 100.0 | 100.0 | 100.0 | 100.0 |

TABLE 1-continued

| Evaluation Results | | | | | | | | |
|---|---|---|---|---|---|---|---|---|
| | (1) State | B | C | C | B | B | B | |
| | (2) Viscosity Stability | C | — | — | B | B | B | |
| | (3) Wettability | Stannum Plated | 1.21 | — | — | 1.30 | 1.31 | 1.20 |
| | | Albata | 0.64 | — | — | 1.02 | 1.05 | 0.72 |
| | (4) Copper Corrosion | B | B | B | B | B | C | |

As is evident from the results of Table 1, it has been found that the solder compositions of the invention (Examples 1 to 5) are favorable in all of state, viscosity stability, wettability, and copper corrosion. It should be noted that the solder compositions of Examples 1 to 5 are not added with a halogen activator and thus a non-halogen solder composition.

Accordingly, it has been found that the solder composition of the invention, although which is a halogen-free or non-halogen composition, is excellent in both wettability and viscosity stability.

What is claimed is:

1. A solder composition comprising:
   a flux composition and (E) solder powder;
   wherein:
   the flux composition comprises (A) a rosin resin, (B) an activator, (C) an imidazoline compound comprising a phenyl group, and (D) an antioxidant;
   the (B) activator comprises (B1) an organic acid,
   the (B1) organic acid comprises (B11) 3-hydroxy-2-naphthoic acid,
   the (C) imidazoline compound comprising the phenyl group is at least one selected from the group consisting of 2-phenylimidazoline and 2-benzylimidazoline,
   a content of the flux composition with respect to 100 mass % of the solder composition is in a range from 5 mass % to 35 mass %,
   a content of the (B1) organic acid is in a range from 1 mass % to 30 mass % with respect to 100 mass % of the flux composition, and
   a content of the (C) imidazoline compound comprising the phenyl group is in a range from 0.1 mass % to 15 mass % with respect to 100 mass % of the flux composition.

2. The solder composition according to claim 1, wherein the (B1) organic acid further comprises at least one selected from the group consisting of (B12) succinic acid and glutaric acid.

3. The solder composition according to claim 1, wherein the (B1) organic acid further comprises at least one selected from the group consisting of (B13) sebacic acid and eicosanedioic acid.

4. The solder composition according to claim 1, wherein the (D) antioxidant comprises at least one selected from the group consisting of a hindered phenol compound, 3,3'-thiodipropionic acid didodecyl, and 1,2,3-benzotriazole.

5. The solder composition according to claim 4, wherein the (D) antioxidant comprises the hindered phenol compound, and the hindered phenol compound is at least one selected from the group consisting of pentaerythritol tetrakis [3-(3,5-di-tert-butyl-4-hydroxyphenyl)propionate], bis[3-(3-tert-butyl-4-hydroxy-5-methylphenyl)propionic acid] [ethylenebis(oxyethylene)], N,N'-bis[2-[2-(3,5-di-tert-butyl-4-hydroxyphenyl)ethylcarbonyloxy]ethyl]oxamide, and N,N'-bis{3-(3,5-di-tert-butyl-4-hydroxyphenyl) propionyl}hydrazine.

6. The solder composition according to claim 1, wherein
   a content of the (A) rosin resin is in a range from 20 mass % to 70 mass % with respect to 100 mass % of the flux composition,
   a content of the (B) activator is in a range from 3 mass % to 35 mass % with respect to 100 mass % of the flux composition, and
   a content of the (D) antioxidant is in a range from 0.1 mass % to 10 mass % with respect to 100 mass % of the flux composition.

7. The solder composition according to claim 1, wherein a chlorine concentration in the solder composition is 900 mass ppm or less, a bromine concentration in the solder composition is 900 mass ppm or less, an iodine concentration in the solder composition is 900 mass ppm or less, and a halogen concentration in the solder composition is 1500 mass ppm or less.

8. An electronic substrate comprising a soldered portion to which the solder composition according to claim 1 is applied.

9. The electronic substrate according to claim 8, wherein the electronic substrate comprises an electronic component comprising an electrode formed from albata or a stannum-plated material.

10. The solder composition according to claim 1, wherein the (C) imidazoline compound comprising the phenyl group is 2-benzylimidazoline, and
    a difference between viscosity values obtained from the following method is in a range from −5 Pa·s to 5 Pa·s:
    leaving the solder composition in a container at a temperature of 25 degrees C. for two to three hours; stirring the solder composition in the container for one to two minutes using a spatula so as to keep air from being trapped; putting the container with the solder composition into a viscometer and agitating the container with the solder composition at a rotation speed of 10 rpm at a temperature of 25 degrees C. for three minutes; after the temperature becomes constant, agitating the container with the solder composition at a rotation speed of 10 rpm for three minutes to measure an initial viscosity of the solder composition; after the container is agitated at a rotation speed of 10 rpm at a temperature of 25 degrees C. for 24 hours, measuring a post-agitation viscosity; and obtaining the difference between viscosity values by subtracting the initial viscosity from the post-agitation viscosity.

* * * * *